(12) United States Patent
Liu et al.

(10) Patent No.: US 6,204,147 B1
(45) Date of Patent: Mar. 20, 2001

(54) METHOD OF MANUFACTURING SHALLOW TRENCH ISOLATION

(75) Inventors: Chun-Liang Liu; Shih-Ming Lan; Hsien-Liang Meng, all of Hsinchu (TW)

(73) Assignee: United Silicon Incorporated, Hsinchu (TW)

( * ) Notice: Subject to any disclaimer, the term of this patent is extended or adjusted under 35 U.S.C. 154(b) by 0 days.

(21) Appl. No.: 09/270,030

(22) Filed: Mar. 16, 1999

(51) Int. Cl.$^7$ .................................................. H01L 21/76
(52) U.S. Cl. .......................... 438/424; 438/296; 438/400
(58) Field of Search ................................. 438/424, 410, 438/414, 425, 435, 437, 296, 400

(56) References Cited

U.S. PATENT DOCUMENTS

| | | | |
|---|---|---|---|
| 5,981,353 | * 11/1999 | Tsai | 438/424 |
| 6,001,704 | * 12/1999 | Cheng et al. | 438/410 |
| 6,020,251 | * 2/2000 | Peng et al. | 438/425 |
| 6,066,543 | * 5/2000 | Takahashi et al. | 438/424 |
| 6,087,243 | * 7/2000 | Wang | 438/424 |

* cited by examiner

Primary Examiner—David Nelms
Assistant Examiner—Phuc T. Dang
(74) Attorney, Agent, or Firm—Jiawei Huang; J C Patents

(57) ABSTRACT

A method for manufacturing a shallow trench isolation. A substrate is provided, wherein the substrate has a pad oxide on the substrate and a silicon nitride layer on the pad oxide layer, and a trench penetrates through the silicon oxide layer and the pad oxide layer and into the substrate. A first oxide layer is conformally formed on the silicon nitride layer and in the trench. A rapid thermal process is performed. A second oxide layer is formed on the oxide layer to fill the trench. Portions of the first and the second oxide layers are removed to expose the silicon nitride layer.

14 Claims, 2 Drawing Sheets

METHOD OF MANUFACTURING SHALLOW TRENCH ISOLATION

BACKGROUND OF THE INVENTION

1. Field of the Invention

The present invention relates to a method of manufacturing a semiconductor device. More particularly, the present invention relates to a method of manufacturing a shallow trench isolation.

2. Description of the Related Art

An isolation region is formed in an integrated circuit for the purpose of separating neighboring device regions of a substrate and preventing the carriers from penetrating through the substrate to neighboring devices. In a dynamic random access memory (DRAM) device, for example, the field effect transistors (FETs) are isolated from each other by isolation regions in order to prevent current leakage among the FETs.

Currently, shallow trench isolation (STI) technique employs a method of forming isolation regions. Shallow trench isolation is formed by first anisotropically etching to form a trench in the substrate having a pad oxide layer thereon and a silicon nitride layer on the pad oxide layer, and then depositing an oxide layer in the trench and over the substrate. Next, a chemical-mechanical polishing step is used to planarize the oxide layer to expose the surface of the silicon nitride layer. In the subsequent step, a wet etching step is used to remove successively the silicon nitride layer and the pad oxide layer. At this point, the STI process is finished.

As shown in FIG. 1, since the etching rate of the STI 24 is faster than that of the silicon nitride layer (not shown), portions of the STI 24 removed by the wet etching are thicker than the silicon nitride layer while the silicon nitride layer is removed by the wet etching to expose the surface of the pad oxide layer. Therefore, the STI 24 has substantially the same surface level as the surface of a substrate 10.

However, because the etching rate of the STI edge is faster than that of the centric STI, there are many recess defects 26 formed on the surface of the STI 24 along the top edge of the trench 18 while the silicon nitride layer and the pad oxide layer (not shown) are stripped away. The recess defects 26 lead to leakage and short circuit of the devices. Moreover, the reliability and the yield of the devices are reduced.

SUMMARY OF THE INVENTION

It is therefore an objective of the invention to provide a method of manufacturing a shallow trench isolation. By using the invention, reliability and yield can be improved.

To achieve these and other advantages and in accordance with the purpose of the invention, as embodied and broadly described herein, the invention provides a method of manufacturing a shallow trench isolation. A substrate is provided, wherein the substrate has a pad oxide on the substrate and a silicon nitride layer on the pad oxide layer and a trench penetrates through the silicon oxide layer and the pad oxide layer and into the substrate. A first oxide layer is formed on the silicon nitride layer conformally. A rapid thermal process is performed. A second oxide layer is formed on the oxide layer to fill the trench. Portions of the first and the second oxide layers are removed to expose the silicon nitride layer. Since the first oxide layer is shrunk after the rapid thermal process is performed, there is no void in the shallow trench isolation after the second oxide layer fills the trench. Moreover, after the rapid thermal process is performed, the etching rate of the first oxide layer is similar to that of the second oxide layer. Therefore, the shallow trench isolation can be prevented from the recess defects formed on the shallow trench along the top edge of the trench and the problems such as leakage and short circuit, which are caused by the recess defects, can be overcome.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
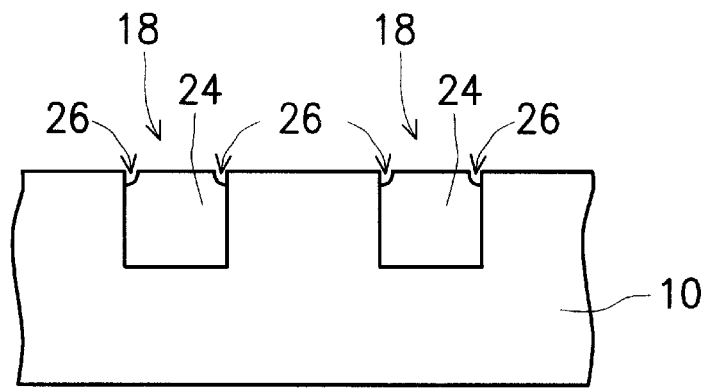
FIG. 1 is a schematic, cross-sectional views of a STI.

Reference will now be made in detail to the present embodiments of the invention, examples of which are illustrated in the accompanying drawings. Wherever possible, the same reference numbers are used in the drawings and the description to refer to the same or like parts.

FIGS. 2A through 2E are schematic, cross-sectional views of the process for manufacturing a STI in a preferred embodiment according to the invention.

Figure 2A:
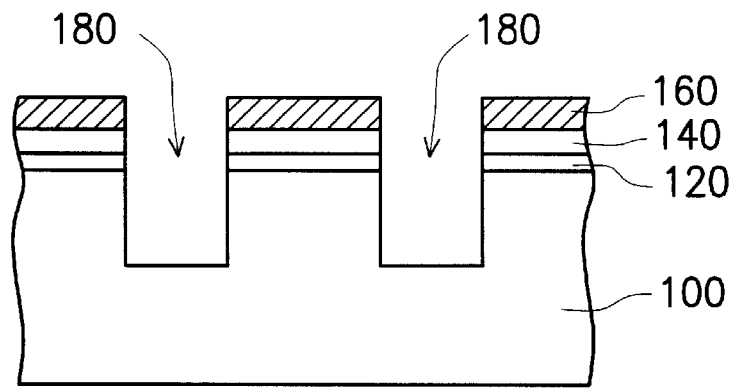
FIGS. 2A through 2E are schematic, cross-sectional views of the process for manufacturing a STI in a preferred embodiment according to the invention.

As shown in FIG. 2A, a pad oxide layer 120 is formed on a substrate 100. The method of forming the pad oxide layer 120 can be thermal oxidation, for example. The thickness of the pad oxide layer 120 is about 50–500 angstroms. A silicon nitride layer 140 is formed on the pad oxide layer 120. The method of forming the silicon nitride layer 140 can be chemical vapor deposition. A patterned photoresist 160 is formed on the silicon nitride layer 140. By using the photoresist 160 as a mask layer, the silicon nitride layer 140, the pad oxide layer 120 and the substrate 100 are patterned to form a trench 180 in the substrate 100. The method of forming the trench 180 can be dry etching or wet etching, for example. Typically, the preferred method of forming the trench 180 is anisotropic etching. The distance from the top edge face of the substrate 100 to the bottom of the trench 180 is about 2000–5000 angstroms. The photoresist 160 is removed.

Figure 2B:
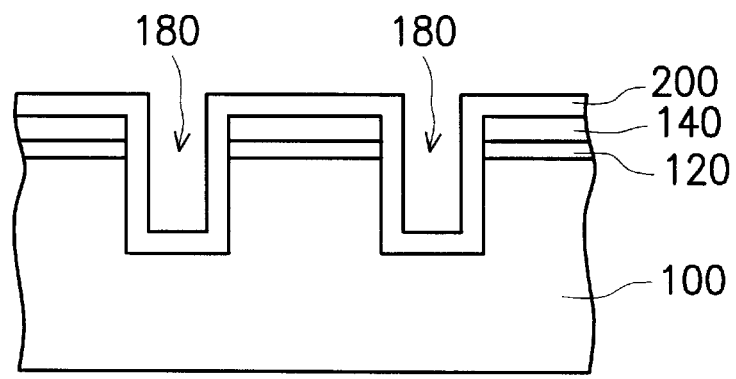

As shown in FIG. 2B, an oxide layer 200 is conformally formed on the silicon nitride layer 140 and in the trench 180. The method of forming the oxide layer 200 can be atmospheric pressure chemical vapor deposition (APCVD) using relatively low $O_3$/TEOS as a gas source, for example. A rapid thermal process (RTP) is used to densify the oxide layer 200. In this example, the condition of the rapid thermal process is a temperature about 500–1100° C. in ammonium gas. After the RTP is performed, the oxide layer 200 is shrunk. Because of shrinkage of the oxide layer 200, there is no void in the subsequently formed STI after a subsequently formed oxide layer fills the trench 180. Moreover, after the RTP is performed, the etching rate of the oxide layer 200 formed by using relatively low $O_3$/TEOS as a gas source is similar to that of the subsequently formed oxide layer formed by using relatively high $O_3$/TEOS as a gas source. Therefore, the subsequently formed STI can be prevented from the recess defects formed on STI along the top edge of the trench 180 and the problems such as leakage and short circuit, which are caused by the recess defects, can be overcome. Hence, the reliability and the yield of the devices can be improved.

Figure 2C:
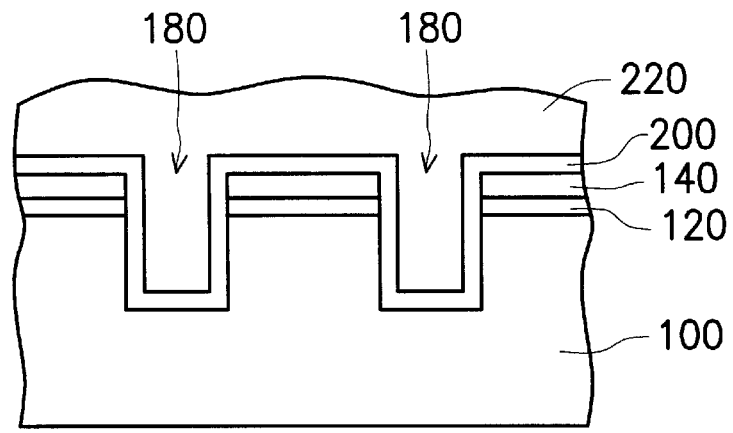

As shown in FIG. 2C, a thick oxide layer 220 is formed on the oxide layer 200 and fills the trench 180. The method of forming the thick oxide layer 220 can be APCVD using relatively high $O_3$/TEOS as a gas source.

Figure 2D:
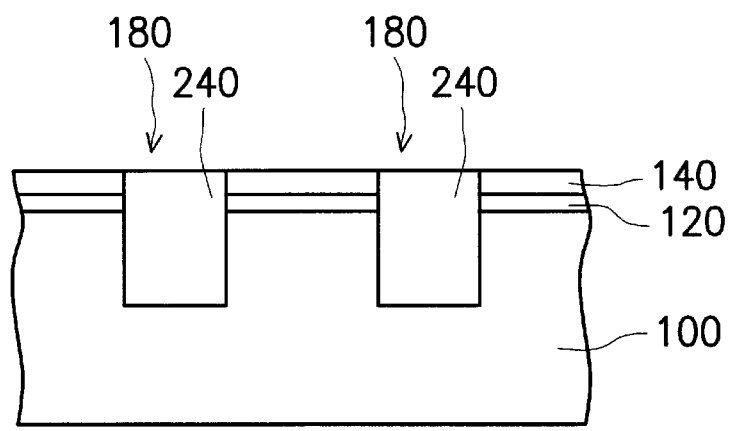

As shown in FIG. 2D, a CMP step is used to remove the oxide layers 220 and 200 until the surface of the silicon nitride layer 140 is exposed. The remaining silicon oxide in the trench 180 is transformed into an oxide plug 240.

Figure 2E:
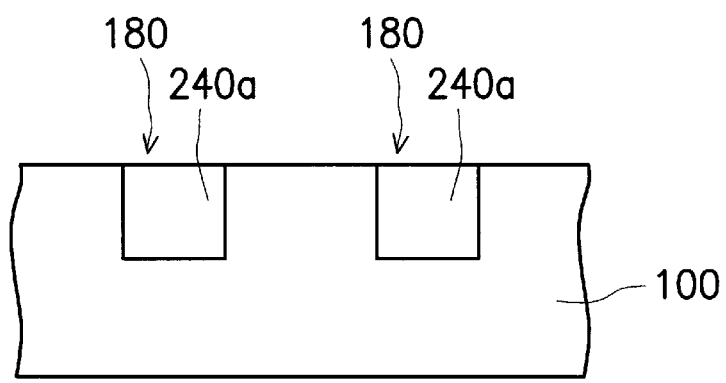

As shown in FIG. 2E, the silicon nitride layer 140 is removed to expose the surface of the pad oxide layer 120. The method of removing the silicon nitride layer 140 can be wet etching using hot phosphoric acid solution, for example. The pad oxide layer 120 is removed to expose the surface of the substrate 100. The method of removing the pad oxide layer 120 can be wet etching using hydrofluoric acid (HF) solution. Since the etching rate of the oxide plug 240 is faster than that of the silicon nitride layer 140, portions of the oxide plug 240 removed by wet etching are thicker than the silicon nitride layer 140. The remaining oxide plug 240 is transformed into a STI 240a and the STI 240a has substantially the same surface level as the surface of the substrate 100.

The present invention has following advantages:
1. In the invention, after an oxide layer is conformally formed, by using relatively low $O_3$/TEOS as a gas source, on the silicon nitride layer and in the trench, a rapid thermal process is performed. The etching rate of the oxide layer formed by using relatively low $O_3$/TEOS as a gas source is similar to that of the oxide layer formed by using relatively high $O_3$/TEOS as a gas source, so that the recess defects are not formed on the STI along the top edge of the trench.
2. In the invention, after an oxide layer is conformally formed on the silicon nitride layer and in the trench, a rapid thermal process is performed. Since oxide layer is shrunk after the rapid thermal process is performed, there is no void in the STI after oxide layer fills the trench.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a shallow trench isolation in a substrate, the substrate comprising a trench formed by patterning the substrate, a pad oxide layer on the substrate and a silicon nitride layer on the pad oxide, the method comprising the steps of:
   forming a conformal first oxide layer on a surface of the trench and the silicon nitride layer without filling the trench;
   performing a rapid thermal process on the conformal first oxide layer;
   forming a second oxide layer on the first oxide layer to fill the trench; and
   removing portions of the first and the second oxide layers to expose the substrate.

2. The method of claim 1, wherein the condition of the rapid thermal process is a temperature about 500–1100° C. in ammonium gas.

3. The method of claim 1, wherein the step of forming the first oxide layer includes atmospheric pressure chemical vapor deposition using relatively low $O_3$/TEOS as a gas source.

4. The method of claim 1, wherein the step of forming the second oxide layer includes atmospheric pressure chemical vapor deposition using relatively high $O_3$/TEOS as a gas source.

5. The method of claim 1, wherein the step of removing portions of the first and the second oxide layers includes chemical-mechanical polishing.

6. The method of claim 1, wherein after the step of removing portions of the first and the second oxide layers further comprises the steps of:
   removing the silicon nitride layer to expose the pad oxide layer; and
   removing the pad oxide layer to expose the substrate.

7. The method of claim 6, wherein the step of removing the silicon nitride layer includes wet etching using hot phosphoric acid solution.

8. The method of claim 6, wherein the step of removing the pad oxide layer includes wet etching using hydrofluoric acid solution.

9. A method of manufacturing a shallow trench isolation in a substrate which has a trench formed by patterning the substrate and a silicon nitride layer over the substrate, the method comprising the steps of:
   forming a conformal relatively low $O_3$/TEOS layer on the silicon nitride layer and a surface of the trench;
   performing a rapid thermal process to equalize the etching rate of the relative low $O_3$/TEOS layer and that of the subsequently formed relatively high $O_3$/TEOS layer;
   forming a relatively high $O_3$/TEOS layer on the relatively low $O_3$/TEOS layer to fill the trench; and
   removing portions of the relatively high and low $O_3$/TEOS layers to expose the substrate.

10. The method of claim 9, wherein the condition of the rapid thermal process is a temperature about 500–1100° C. in ammonium gas.

11. The method of claim 9, wherein the step of forming the conformal relatively low $O_3$/TEOS layer includes atmospheric pressure chemical vapor deposition.

12. The method of claim 9, wherein the step of forming the relatively high $O_3$/TEOS layer includes atmospheric pressure chemical vapor deposition.

13. The method of claim 9, wherein the step of removing portions of the relatively high and low $O_3$/TEOS layers includes chemical-mechanical polishing.

14. A method of manufacturing a shallow trench isolation in a substrate, the method comprising:
   forming a pad oxide layer and a silicon nitride layer on the substrate;
   removing portions of the substrate, the pad oxide layer and the silicon nitride layer to form a trench in the substrate;
   forming a first oxide layer to cover an exposed surface of the trench and th e silicon nitride layer without filling the trench;
   performing a rapid thermal process;
   forming a second oxide layer on the first oxide layer to fill the trench, the second oxide layer having an etching rate similar to that of the first oxide layer; and
   performing a chemical mechanical polishing step to remove the first and second oxide layers above the silicon nitride layer; and
   removing the silicon nitride layer and the pad oxide layer.

* * * * *